(12) United States Patent
Seong et al.

(10) Patent No.: US 9,764,541 B2
(45) Date of Patent: Sep. 19, 2017

(54) CLICHÉ AND PRINTING APPARATUS COMPRISING SAME

(71) Applicant: LG CHEM, LTD., Seoul (KR)

(72) Inventors: Jiehyun Seong, Daejeon (KR); Seung Heon Lee, Daejeon (KR); Yong Goo Son, Daejeon (KR); Ji Young Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 170 days.

(21) Appl. No.: 14/402,829

(22) PCT Filed: May 31, 2013

(86) PCT No.: PCT/KR2013/004844
§ 371 (c)(1),
(2) Date: Nov. 21, 2014

(87) PCT Pub. No.: WO2013/180534
PCT Pub. Date: Dec. 5, 2013

(65) Prior Publication Data
US 2015/0132477 A1    May 14, 2015

(30) Foreign Application Priority Data

May 31, 2012  (KR) .................. 10-2012-0058041
May 31, 2012  (KR) .................. 10-2012-0058059
May 31, 2012  (KR) .................. 10-2012-0058238

(51) Int. Cl.
*B41N 1/12*   (2006.01)
*B41N 1/00*   (2006.01)
*B41C 1/06*   (2006.01)
*B41C 1/00*   (2006.01)
*G03F 7/20*   (2006.01)

(52) U.S. Cl.
CPC .................. *B41C 1/06* (2013.01); *B41C 1/00* (2013.01); *G03F 7/201* (2013.01); *G03F 7/2002* (2013.01)

(58) Field of Classification Search
CPC ..................................... B41N 1/12; B41N 1/00
See application file for complete search history.

(56) References Cited

U.S. PATENT DOCUMENTS

| 6,177,187 B1 * | 1/2001 | Niemoller ............... B41M 5/52 428/304.4 |
| 2004/0161704 A1 * | 8/2004 | Huang .................... B41C 1/003 430/303 |
| 2005/0155505 A1 * | 7/2005 | Jeurink ................. B41F 27/105 101/375 |

FOREIGN PATENT DOCUMENTS

| JP | 2004-142337 A | 5/2004 |
| JP | 2004142337 A * | 5/2004 |
| JP | 2005133010 A | 5/2005 |
| JP | 2006281483 A * | 10/2006 |
| JP | 2010105185 A | 10/2008 |
| JP | 2008-296541 A | 12/2008 |
| JP | 2010105185 A * | 5/2010 |
| KR | 1020070070512 A | 7/2007 |
| KR | 1020080073985 A | 8/2008 |
| KR | 1020100009919 A | 1/2010 |
| KR | 1020110013758 A | 2/2011 |
| KR | 1020110023776 A | 3/2011 |

(Continued)

*Primary Examiner* — Cachet Sellman
(74) *Attorney, Agent, or Firm* — Dentons US LLP

(57) ABSTRACT

The present specification describes a cliché, a method of manufacturing the cliché, and a printing method using the cliché.

16 Claims, 22 Drawing Sheets

(56) References Cited

FOREIGN PATENT DOCUMENTS

| KR | 20120014707 A | * | 2/2012 |
| KR | 1020120014707 A | | 2/2012 |
| KR | 1020120028579 A | | 3/2012 |

* cited by examiner

CLICHÉ AND PRINTING APPARATUS COMPRISING SAME

TECHNICAL FIELD

This application is a 35 USC §371 National Stage entry of International Application No. PCT/KR2013/004844, filed on May 31, 2013, which claims priority of Korean Application No. 10-2012-0058059, filed on May 31, 2012, Korean Application No. 10-2012-0058041, filed May 31, 2012 and Korean Application No. 10-2012-0058238, filed on May 31, 2012, all of which are hereby incorporated by reference in their entirety.

BACKGROUND ART

Various electronic material patterns are used in electronic products. For example, in the case of a display, patterns of electronic materials having various functions are used in a color filter substrate, a transistor substrate, an electrode substrate, and the like.

In order to form the electronic material patterns, use of a method such as a photolithography method, a plating method, and a printing method has been conducted.

Currently, it is required that the electronic material patterns used in the electronic products have a finer scale, and thus there is a demand for development of a material, a method, or a device for forming the electronic material pattern.

SUMMARY OF THE INVENTION

The present invention has been made in an effort to develop a method or a device for forming an electronic material pattern, which precisely forms the electronic material pattern or improves process efficiency which is required in the art.

An exemplary embodiment described in the present specification provides a cliché including a support roll; and a flexible base provided to surround at least one surface of the support roll and having an uneven portion, in which a porous sheet is provided between the support roll and the flexible base.

Another exemplary embodiment described in the present specification provides a method of manufacturing the cliché.

Another exemplary embodiment described in the present specification provides a printing device including the cliché.

Another exemplary embodiment described in the present specification provides a printing method using the cliché.

Since the cliché according to the exemplary embodiment described in the present specification is flexible, there is no worry about breakage unlike a known glass or silicon wafer, and manufacturing thereof is easy and manufacturing costs thereof are low as compared to a cliché made of iron, such as SUS.

According to the exemplary embodiment described in the present specification, even when a material where there is no worry about breakage unlike the glass or silicon wafer and manufacturing thereof is easy and the manufacturing costs thereof are low as compared to the cliché made of iron, such as SUS, is used as a cliché base, it is possible to smoothly strip ink on the cliché by controlling surface properties of the cliché by a SiOx layer.

Particularly, since a flexible base may be used as the base of the cliché according to the exemplary embodiment of the present specification, it is largely advantageous in manufacturing the cliché in a roll type in order to apply the cliché to a roll to roll manner, and if the cliché according to the exemplary embodiment of the present specification, which is wound in the roll type, is used, it is possible to use the cliché for single-use without washing.

DETAILED DESCRIPTION

Hereinafter, exemplary embodiments described in the present specification will be described in detail.

Figure 1:
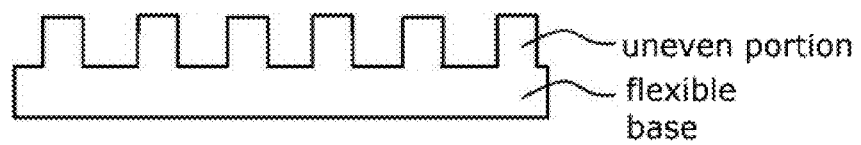
FIG. 1 illustrates a transversal cross-sectional structure of a cliché according to an exemplary embodiment described in the present specification.
Figure 10:
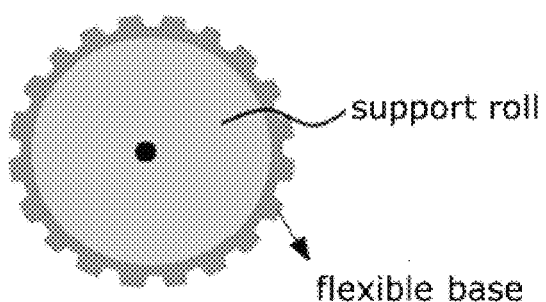
FIGS. 10 and 11 illustrate the cliché including a roll-type support portion according to the exemplary embodiment described in the present specification.

A cliché according to a first exemplary embodiment described in the present specification includes a support roll; and a flexible base provided to surround at least one surface of the support roll and having an uneven portion. The flexible base having the support roll and the uneven portion is illustrated in FIG. 1, and a transversal cross-sectional structure of the cliché according to the exemplary embodiment is illustrated in FIG. 10.

According to the present specification, manufacturing of the cliché is easy and manufacturing costs thereof are low by forming the uneven portion on the flexible base and providing the flexible base on the support roll to surround the support roll.

In the present specification, the term "flexible" means that flexibility is secured as compared to known glass, silicon, or iron. The flexible base may have a flexible property by a material or a thickness. Herein, the degree of "flexible" is not particularly limited. For example, any base may be used as long as the base can be applied to a required printing process or equipped on a surface of a roll-type support body. Specifically, any base is good as long as cracks are not observed in an optical microscope after the base is left for 24 hours or more in a type of which the base is to be applied or in a state where the base is even more bent. For example, in the case where an external radius of the roll-type support body is 15 centimeters, it is preferable that the cracks be not observed over the optical microscope after the base is left in a bending state for 24 hours or more with the radius of curvature of 15 centimeters. More preferably, in the case where the external radius of the roll-type support body is 15 centimeters, it is preferable that the cracks be not observed over the optical microscope after the base is left in the bending state for 24 hours or more with the radius of curvature of 5 centimeters. Since the cliché described in the present specification has the flexible base, the cliché is easily manufactured in a roll type and process costs thereof are largely reduced. Accordingly, roll to roll continuous printing is feasible.

Figure 11:
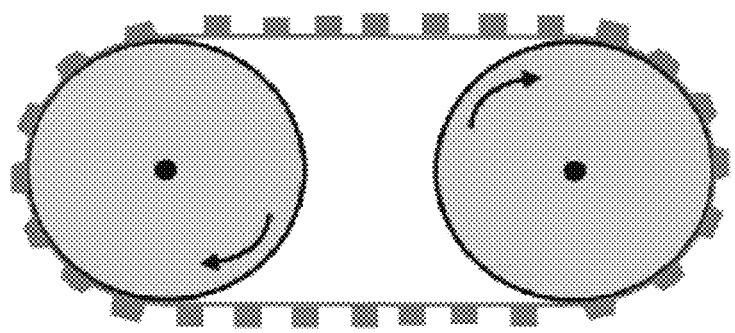

As an example, the cliché described in the present specification may further include a support portion provided on an opposite surface of a surface of the flexible base, on which the uneven portion is provided. In this case, the support portion may be the roll type or a flat panel type. Particularly, in the case where the support portion is the roll type, the flexible base may be equipped on a surface of the support portion without damage. Two or more support rolls disposed to be spaced apart from each other may be included. FIG. 11 illustrates the case where the two support rolls are included. However, FIG. 11 is only to illustrate the present invention, but the scope of the present invention is not limited thereto.

A polymer resin film or a metal foil may be used as the flexible base. For example, a film formed of a polymer resin such as PET (polyethylene terephthalate), PEN (polyethylene naphthalate), PC (polycarbonate), PE (polyethylene), and PI (polyimide) may be used, and a metal foil such as a SUS (steel use stainless) foil, an aluminum foil, and a copper foil may be used, but the flexible base is not limited to the aforementioned examples.

The uneven portion may be integrally formed with the flexible base, or may be in a state where the uneven portion is separately formed on the flexible base and attached thereto. The uneven portion may be formed of the same material as the flexible base, or formed of the base that is different from the flexible base. As the material of the uneven portion, a dry film resist (DFR) material, a photosensitive resin material such as a photoresist (PR) material, a metal material such as copper, a thermosetting or UV curable resin, and the like may be used.

The uneven portion may include the polymer resin, or metal. The uneven portion may be formed of a photosensitive resin, the thermosetting resin, a photocurable resin, or metal.

Particularly, in the case where the UV curable resin is used, it is easy to integrally form the uneven portion with the flexible base.

In the case where the flexible base and the uneven portion are separately manufactured, an additional buffer layer may be provided between the base and the uneven portion, or the base may be subjected to pre-treatment for improvement of adhesion force in order to increase adhesion force therebetween.

For example, in the case where a photoresist material or the UV curable resin is used as the uneven portion, the base may be treated with hexamethyldisilazane (HMDS), or a silane coupling agent having a vinyl group or an acryl group. In this case, a thin film formed by the aforementioned treatment on the base may have a thickness of 100 nm or less. Further, the base may be treated in advance by a primer which can improve adhesion force. Further, the thin film of copper, chrome, nickel, or ITO may be formed on the base, and in this case, also, the thin film may have a thickness of 100 nm or less. In addition, other methods of improving adhesion force used in a photoresist-related technology may be used.

Further, in the case where the uneven portion is formed of metal, the molybdenum, titanium, or nickel thin film may be deposited on the base to form the buffer layer in order to improve adhesion force of the base and the uneven portion. In this case, a thickness of the buffer layer may be adjusted according to a forming method or a thickness of the metal layer. For example, the thickness of the buffer layer may be 100 nm or less or 20 nm or less.

In the uneven portion, a line width, a line interval, a depth, and the like may be adjusted according to a use purpose of the cliché, a shape of a printed matter, and a kind of used printing composition.

For example, the depth of the uneven portion may be adjusted to 1 micrometer or more, 1.5 micrometers or more, or 2 micrometers or more.

The present specification may provide the flexible cliché having the uneven portion having the large depth as described above by using methods which will be described later. In order to serve as the cliché, the larger the depth of an uneven portion pattern is, the better the cliché is.

Figure 12:
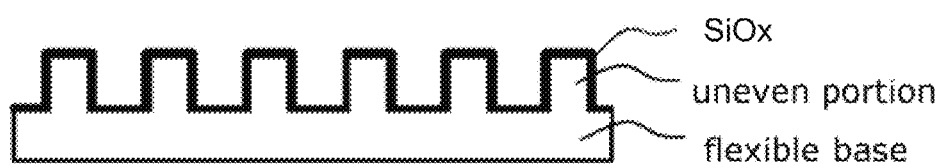
FIG. 12 illustrates a transversal cross-sectional structure of the cliché according to the exemplary embodiment described in the present specification.

According to another exemplary embodiment, the cliché includes a SiOx layer provided on the surface of the base, on which the uneven portion is provided. A transversal cross-sectional structure of the cliché according to the exemplary embodiment is illustrated in FIG. 12. Herein, x may be 1 or more and 2 or less.

Even in the case where in the cliché according to the present specification, glass or quartz is not used as the base, a surface property thereof is improved by the SiOx layer. Specifically, ink applied on a surface of the cliché is smoothly stripped to make precise transferring on a print target body possible.

The surface of the base, on which the uneven portion is provided, may be subjected to surface activation treatment before the SiOx layer is formed. In the case where the surface activation treatment is performed, a method thereof may be corona treatment, or oxygen plasma or air plasma treatment. Surface energy of the surface of the base, on which the uneven portion is provided, may be temporarily increased by the surface activation treatment to easily apply a material forming the SiOx layer thereon. The reason why surface energy is temporarily increased is that the surface of the uneven portion of the base is oxidized by the surface activation treatment to be changed into a functional group having high surface energy, such as a carboxylic acid group or a hydroxy group, according to a component of the uneven portion and/or a surface activation treatment condition. If the SiOx layer is formed without performing the surface activation treatment, in the case where surface energy of a base uneven portion material is low, it is not easy to uniformly form the SiOx layer. The case where the SiOx layer is formed without performing the surface activation treatment is illustrated in Comparative Example 2 and FIG. 27.

Because of this mechanism, even though surface energy is low when the surface activation treatment is not performed, for example, surface energy is less than 40 dyn/cm, surface energy after the surface activation treatment may be increased to 50 dyn/cm or more, and thus when SiOx treatment is performed thereon, uniform treatment may be performed without agglomeration or pin holes.

A thickness of the SiOx layer depends on a line width and a line height of a pattern of the uneven portion of the base, but is preferably about 10 nm or more and 2 µm or less. In the case where the thickness of the SiOx layer is 10 nm or more, when the cliché is repeatedly used, it is advantageous in prevention of damage to the SiOx layer. Further, in the case where the thickness of the SiOx layer is 2 µm or less, it is advantageous in prevention of damage to the SiOx layer and formation of a precise pattern. For example, in the case where the SiOx layer is uniformly applied in a thickness of more than 2 µm on the entire uneven portion on the base, since the line width of the pattern may be increased to 4 µm or more in both lateral directions, there is a disadvantage in that a difference is increased as compared to an original pattern shape. Further, the case where the SiOx layer is formed in a thickness of more than 2 µm has other disadvantages in that in the case where the SiOx layer is formed by a deposition process, a deposition time may be excessively long, and in the case where the SiOx layer is formed by a wet coating process, a shrinkage phenomenon may be excessively increased while the SiOx layer is formed to cause cracks. To be more specific, the thickness of the SiOx layer may be 100 nm or more and 1 µm or less.

It is preferable that surface energy of the SiOx layer be 40 dyn/cm or more. An upper limit of a preferable surface energy value of the SiOx layer cannot be specified, but in the case of mica having high surface energy among materials formed of $SiO_2$, since surface energy is about 4,000 dyn/cm, a theoretically possible upper limit of the surface energy value is 4,000 dyn/cm. However, when the upper limit of the surface energy value of the SiOx layer is in the range of 40 to 70 dyn/cm that is a surface energy value range of glass, it is advantageous in views of easiness of manufacturing and continuous sustainability.

In the uneven portion, the line width, the line interval, the depth, and the like may be adjusted according to the use purpose of the cliché, the shape of the printed matter, and the kind of used printing composition.

The larger the depth of the pattern of the uneven portion is, the better the cliché is, but in consideration of convenience of manufacturing, the depth may be adjusted to be 1 micrometer or more or 1.5 micrometers or more, or more preferably 2 micrometers or more.

Figure 16:
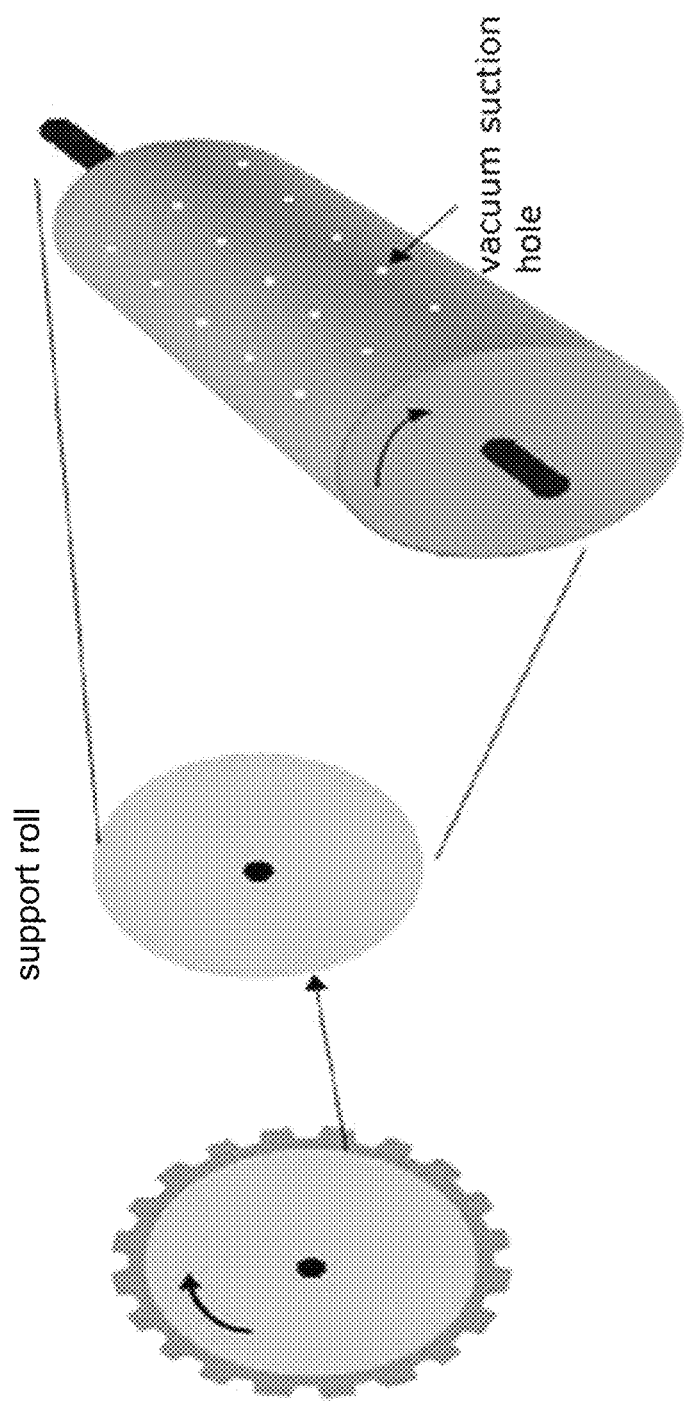
FIG. 16 illustrates a structure where a vacuum suction hole is formed on a surface of a support roll of the cliché according to the exemplary embodiment described in the present specification.

According to another exemplary embodiment of the present specification, a vacuum suction hole is provided on the support roll. FIG. 16 illustrates an example where the vacuum suction hole is provided. In the case where the vacuum suction hole is used, the flexible base may be fixed to the support roll through vacuum adsorption. In this case, the flexible base may be fixed without separate physical or chemical fixing. Thereby, deformation of the flexible base may be minimized, and position precision may be improved.

A shape and a diameter of the hole may be selected in the range in which the flexible base is not deformed by the vacuum suction hole.

The diameter of the hole may vary according to a kind or a thickness of the flexible base. For example, the diameter of the hole may be 5 to 15 times larger than that of the flexible base, but is not limited thereto.

In the case where the flexible base is fixed by using the vacuum suction hole, a printing device including the cliché described in the present specification may further include a vacuum suction unit. The vacuum suction unit is not particularly limited as long as the vacuum suction unit can fix the flexible base onto the support roll through the vacuum suction hole on the support roll. In this case, the lower the degree of vacuum by the vacuum suction unit is as compared to a normal pressure, the better the degree of vacuum is.

In this case, the vacuum means a state where a pressure is lower than the normal pressure (760 mmHg), and the degree of vacuum means a pressure of a gas remaining in a vacuumized vessel by comparing a state of the vacuum to the normal pressure.

The degree of vacuum by the vacuum suction unit is not particularly limited as long as the flexible base is not deformed according to the kind and the thickness of the used flexible base but fixed to the support roll.

For example, the pressure existing in a vacuum hole after the vacuum occurs by the vacuum suction unit may be 30% or more and 95% or less of the normal pressure. In the case where the pressure is more than 50% of the normal pressure, if the base is thick, it is difficult to sufficiently fix the base to the support roll, and in the case where the pressure is less than 30% of the normal pressure, a time reaching the vacuum may be long, or if the base is not sufficiently thick, the base may be deformed to form vacuum hole marks on the base.

Figure 29:
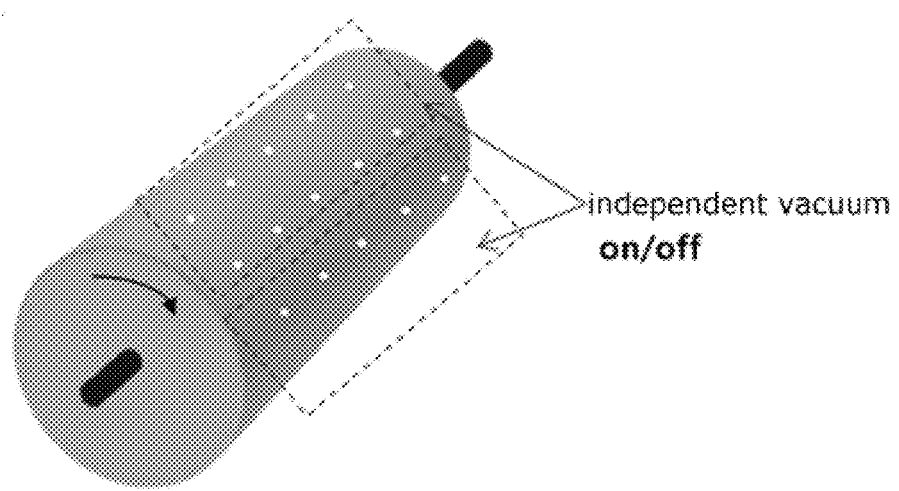
FIG. 29 illustrates the cliché equipped with the flexible base where independent vacuum on/off is possible in a roll progress direction according to the exemplary embodiment described in the present specification.

Meanwhile, when the flexible base is equipped on a cliché roll, independent vacuum on/off is possible in a roll progress direction so that the base is equipped as the roll rotates to sequentially reach a vacuum state. FIG. 29 illustrates a structure where the independent vacuum on/off is possible in the roll progress direction.

Figure 17:
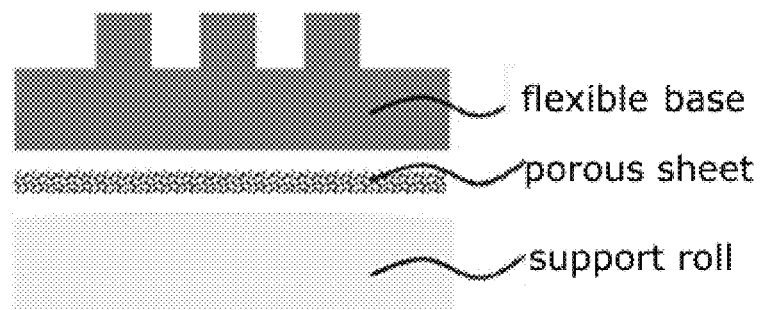
FIGS. 17 and 18 illustrate an example where a porous sheet is provided between the support roll and a flexible base in the cliché according to the exemplary embodiment described in the present specification.
Figure 18:
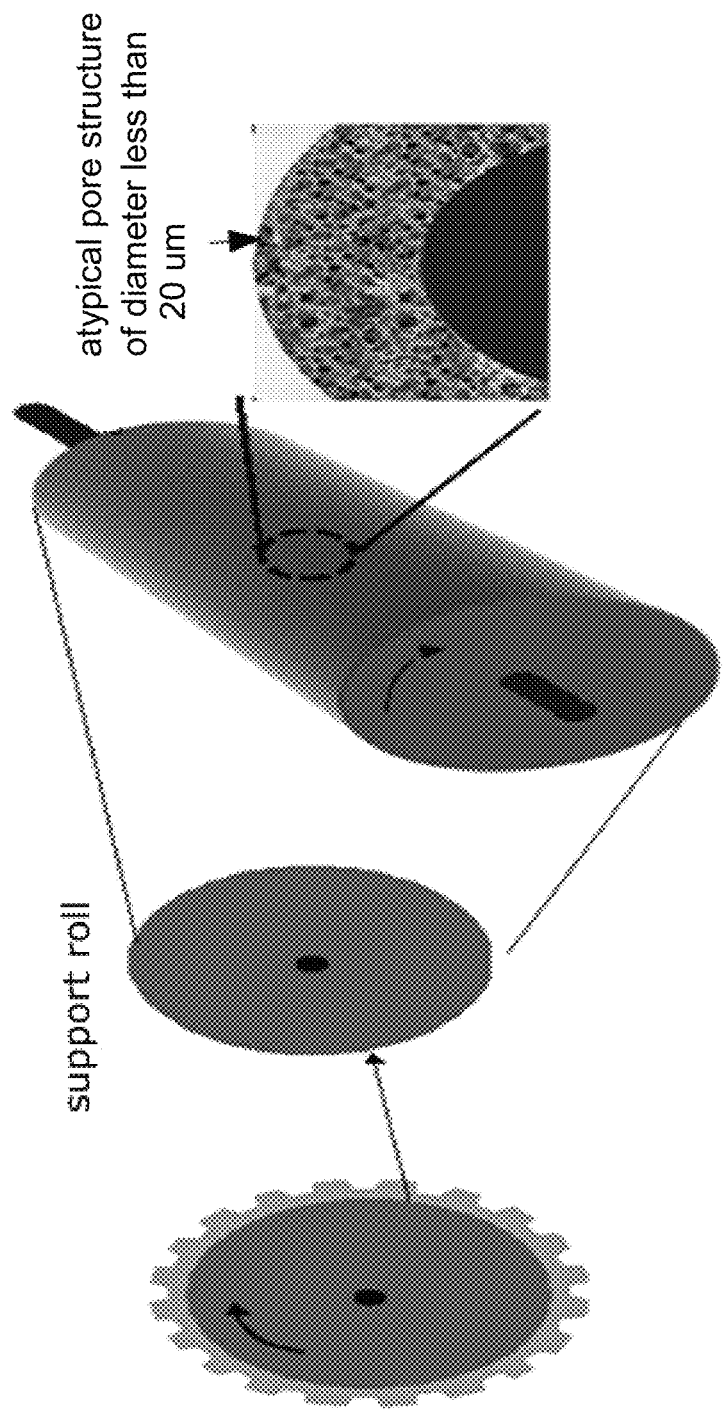

As described above, a porous sheet may be provided between the flexible base and the support roll in order to prevent the occurrence of damage such as formation of the marks on the flexible base or deformation of the flexible base due to a hole structure. FIGS. 17 and 18 illustrate a laminate structure where the porous sheet is provided. A structure, a shape, a material, and the like of the porous sheet are not limited as long as the porous sheet has a porous structure so that vacuum suction is possible and can prevent damage to the flexible base.

The porous sheet may be selected by a person with ordinary skill in the art in consideration of the flexible base and the like.

An average pore size of the porous sheet may be 100 micrometers or less and specifically 30 micrometers or less.

A lower limit of the average pore size of the porous sheet is not particularly limited as long as air can pass therethrough, and may be, for example, 100 nanometers or more.

The average pore size of the porous sheet may be 0.1 micrometers or more and 100 micrometers or less.

If the average pore size of the porous sheet is 100 nanometers, that is, 0.1 micrometers or more, there is no clogging of pores due to suction of dust and the like and it is easy to perform processing.

Meanwhile, if the average pore size of the porous sheet is 100 micrometers or less, when porosity is increased, the porous sheet may have excellent mechanical strength, and thus has an advantage as compared to formation of the small vacuum hole.

The porous sheet may be a sintered body of a ceramic, metal, or a polymer.

A molecular weight of the sintered body of the polymer may be 1,000,000 g/mol or more.

The larger the porosity is, the better the porous sheet is, and the porosity may be specifically 10% or more and preferably 30% or more.

The porosity of the porous sheet may be 10% or more and 50% or less.

If the porosity of the porous sheet is 10% or more, the porous sheet has excellent adsorption force, and if the porosity is 50% or less, it is easy to increase mechanical strength.

In the present specification, the porosity means a volume ratio of a substrate constituting a porous material and a pore existing in the substrate.

The porous sheet may be manufactured by the following method.

A method of manufacturing the porous sheet may include molding raw powder;
heating the molded raw powder; and
sintering the heated raw powder.

The raw powder may be the polymer, the ceramic, or metal.

Figure 19:
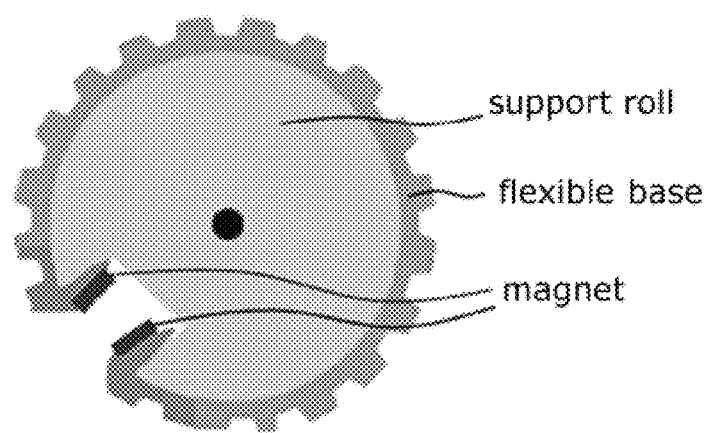
FIG. 19 illustrates an example where the flexible base is fixed to the support roll by a magnet in the cliché according to the exemplary embodiment described in the present specification.

According to another exemplary embodiment of the present specification, both ends of the support roll of the flexible base in a circumferential direction are fixed to the support roll by a magnet. Fixing may be performed on the surface of the support roll, but may be performed in a groove portion of the support roll like FIG. 19. Specifically, the support roll may have the groove portion in a direction that is parallel to a rotation axis of the roll, and the ends of the flexible base may be fixed to the support roll in the groove portion.

Figure 20:
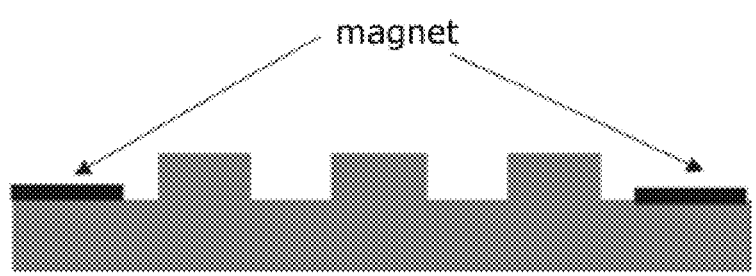
FIG. 20 illustrates an example where the magnets are provided at both ends of the flexible base in order to manufacture the cliché having the same structure as FIG. 19.
Figure 21:
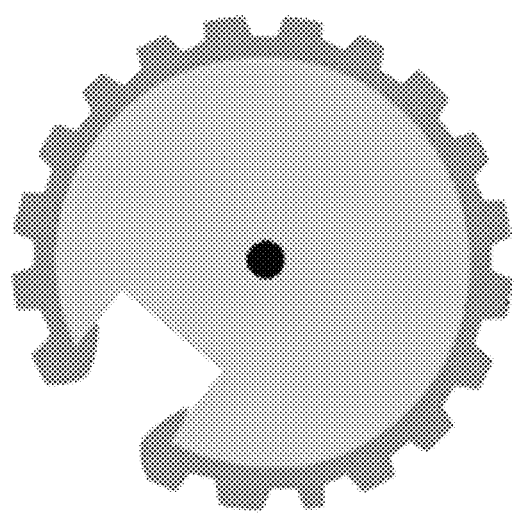
FIG. 21 illustrates an example where both ends of the flexible base are fixed in a groove portion of the support roll in the cliché according to the exemplary embodiment described in the present specification.

As described above, in the case where the magnet is used, there is an advantage in that processing is very simple. To this end, like FIG. 20, after the magnets are disposed at both ends of the flexible base, the flexible base may be fixed to the support roll. In this case, the magnets may be fixed to both ends of the flexible base if necessary, but fixing may not be required according to the intensity of magnetism of the magnet.

As described above, in the case where the magnet is used, if necessary, thicknesses of both ends of the flexible base may be adjusted to be different from that of the remaining portion. For example, fixing force by the magnet may be further increased by adjusting the thicknesses of both ends of the flexible base so as to be smaller than that of the remaining portion.

According to another exemplary embodiment of the present specification, the support roll has the groove portion in a direction that is parallel to the rotation axis of the roll, and the ends of the flexible base are fixed to the support roll in the groove portion. In this case, fixing may be performed by a chemical fixing unit or a physical fixing unit. The chemical fixing unit may be an adhesive or an adhesion sheet. The physical fixing unit may use the assembly of a bolt and a nut.

A method of manufacturing a cliché according to a second exemplary embodiment described in the present specification includes forming an uneven portion on a flexible base; and forming the flexible base to surround a support roll. Hereinafter, several exemplary embodiments relating to the method of manufacturing the cliché will be described.

In the forming of the flexible base on which the uneven portion is formed to surround the support roll, (1) a process of fixing a front end of a start portion of the flexible base in a longitudinal direction of the support roll, (2) a process of rotating the support roll and a blanket roll together while the support roll and the blanket roll come into contact with each other to surround the support roll by the flexible base, and (3) a process of filling a gap between the front end of the start portion of the base and a rear end of an terminated portion thereof with a sealant are performed.

Figure 28:
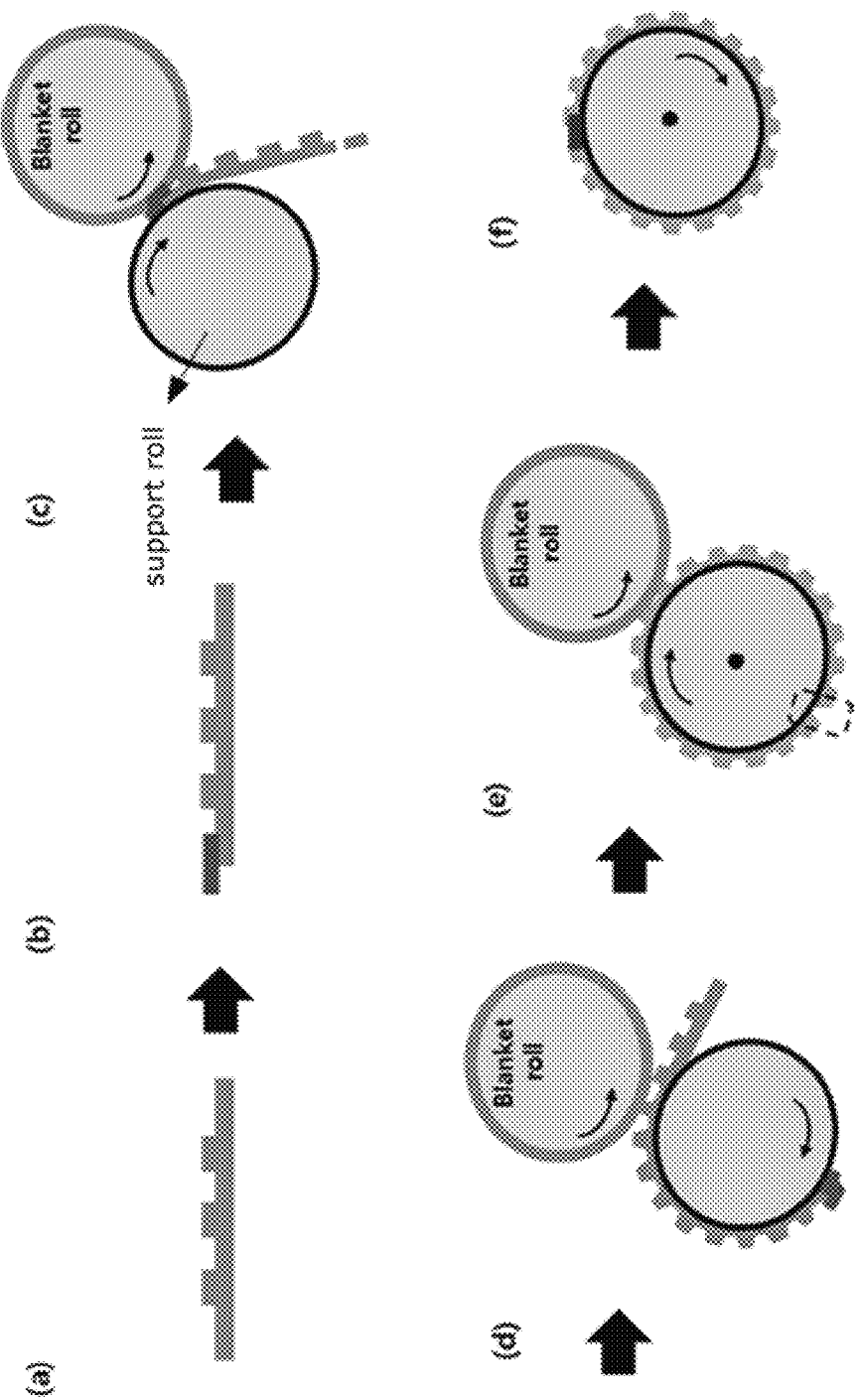
FIG. 28 illustrate a method of manufacturing a cliché according to a second exemplary embodiment.

In this case, the front end of the start portion may be fixed by only a vacuum, and the front end may be fixed in advance by an adhesion tape. FIG. 28 illustrates a method of forming the flexible base on which the uneven portion is formed to surround the support roll. The method of fixing the front end of the start portion of the flexible base in advance by the adhesion tape may be applied to the case where fixing is performed by the vacuum or fixing is performed by other methods such as the magnet.

FIGS. 28A to 28C illustrate the process of fixing the front end of the start portion of the flexible base in the longitudinal direction of the support roll, FIGS. 28D to 28E illustrate the process of rotating the support roll and the blanket roll together while the support roll and the blanket roll come into contact with each other to surround the support roll by the flexible base, and FIG. 28F is a schematic diagram after the gap is filled with the sealant.

Figure 2:
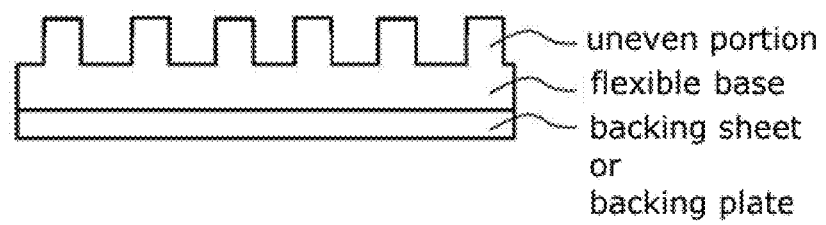
FIGS. 2 to 9 illustrate a manufacturing process of the clichés according to the exemplary embodiments described in the present specification.
Figure 3:
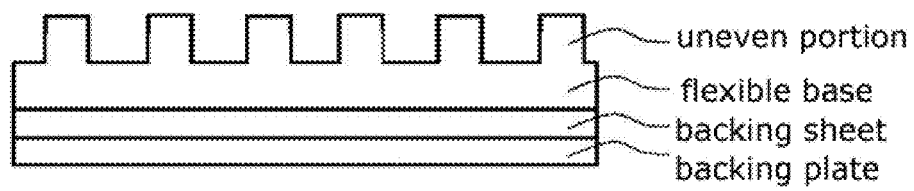

However, the following Examples describe examples where the uneven portion is formed on the flexible base, but if necessary, a backing sheet or a backing plate provided at a lower end of the flexible base may be used. In the case where layer formation, exposure, and the like for forming the uneven portion are not uniformly performed according to a kind of flexible base, as described above, use of a backing sheet or a backing plate is advantageous in formation of a uniform pattern (refer to FIG. 2). If necessary, the backing plate provided at a lower end of the backing sheet may be further used (refer to FIG. 3).

Figure 4:
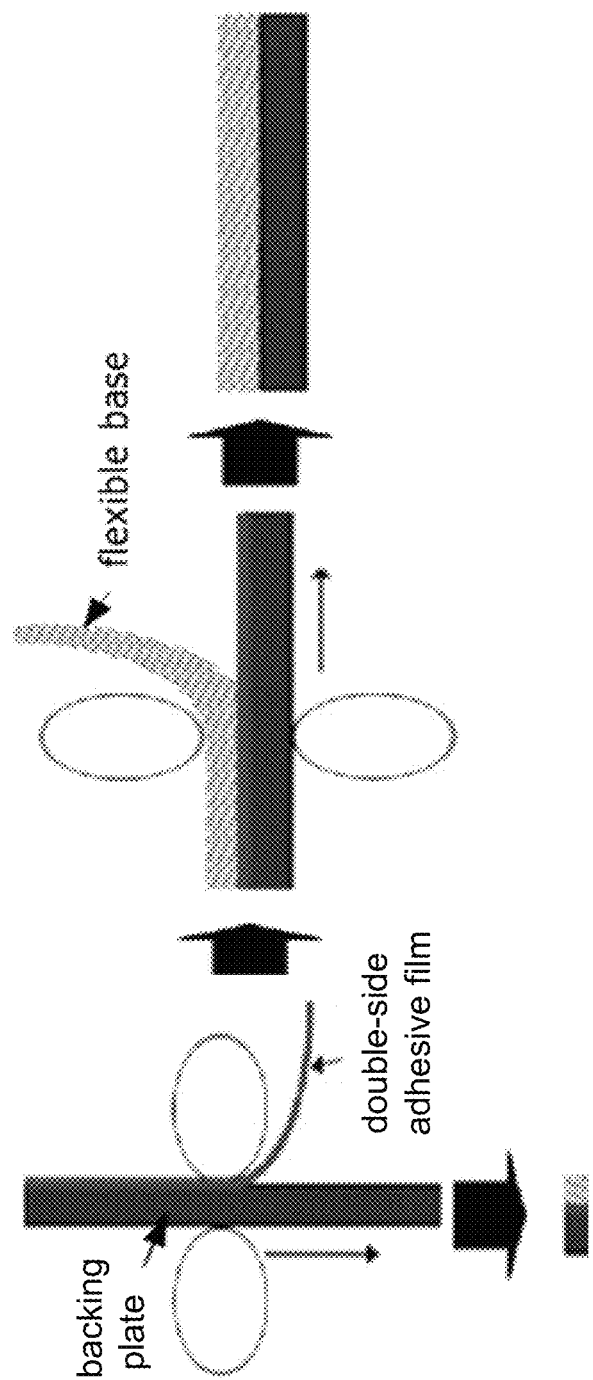
Figure 5:
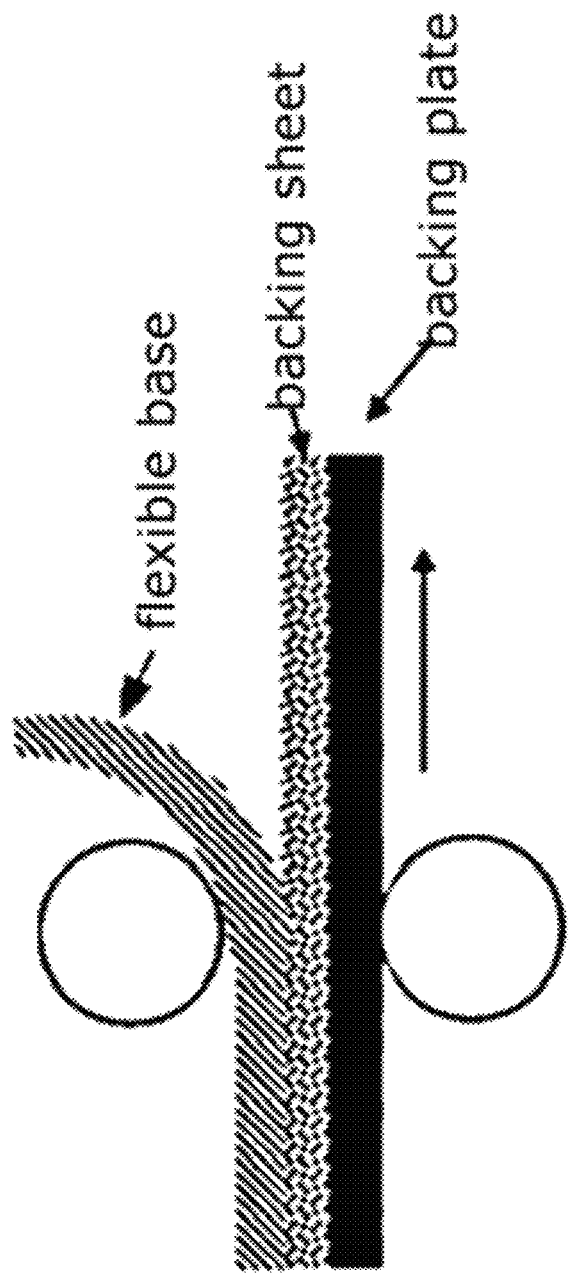

Attachment of the backing sheet or the backing plate and the flexible base may be performed by the roll. As illustrated in FIG. 4 or 5, the base and the backing sheet or the backing plate are laminated, and a pressure may be applied by the roll.

A sheet of a material having an adsorption property to the flexible base may be used as the backing sheet, and for example, a silicon rubber sheet may be used. A matter used as a blanket in a printing process may be used as the silicon rubber sheet. Another non-illustrative example of the backing sheet may include a porous film or a porous sheet. Normally, the porous film or the porous sheet has no adsorption property to the flexible base. However, if the flexible base is mounted on the porous film or the porous sheet and the vacuum is formed under the porous film or the porous sheet, the porous film or the porous sheet may be adsorbed onto the flexible base due to the vacuum. Accordingly, the porous film or the porous sheet may serve as a support body of the flexible base under the vacuum in working. After the working is finished, if the vacuum is released, the flexible base may be easily separated back from the support body.

A hard substrate such as glass, silicon wafer, and iron substrates may be used as the backing plate. If necessary, a double-sided adhesive film for attaching the flexible base and the backing plate may be used. However, the backing sheet, the backing plate, and the double-sided adhesive film are required in a process of manufacturing the cliché, and thus may be separated after the cliché is manufactured.

According to a first aspect, an uneven portion may be formed on a flexible base by using a photosensitive material.

Figure 6:
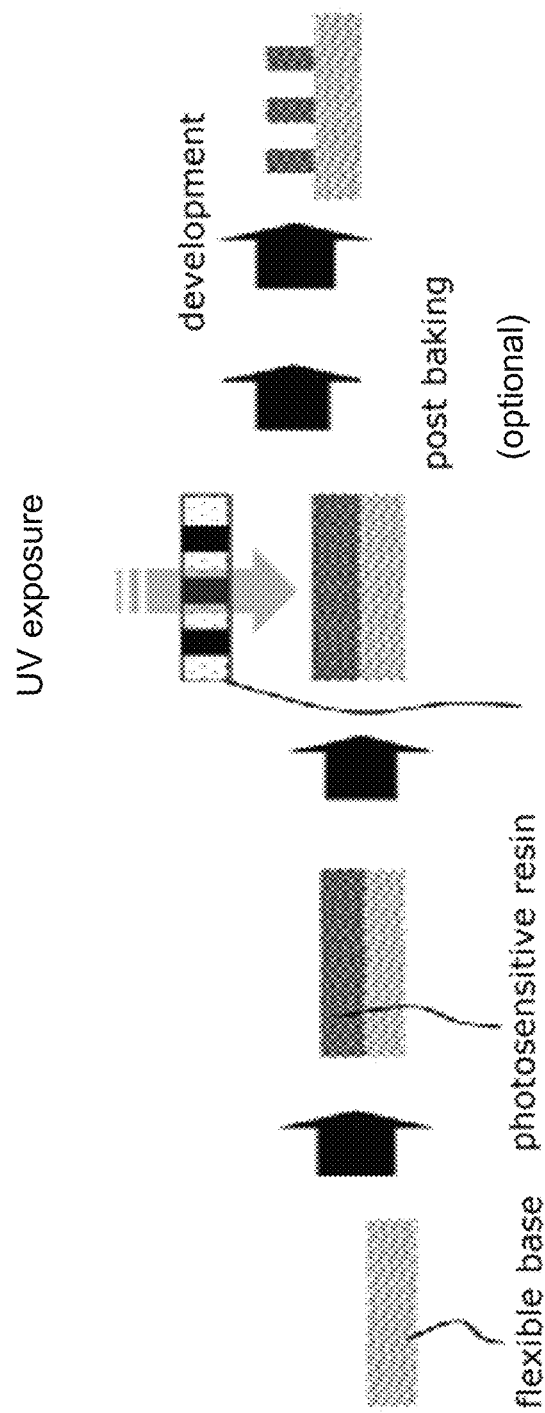

A schematic diagram of a manufacturing method according to the first aspect is illustrated in FIG. 6.

According to FIG. 6, a layer may be formed of a photosensitive resin on the flexible base, and developing may be performed after selective UV exposure using a photomask to form an uneven portion pattern. In this case, if necessary, pre-baking may be performed before developing, post-baking may be performed after developing, or both may be performed. As described above, in order to improve adhesion force between the base and the uneven portion, the base may be treated by hexamethyldisilazane (HMDS), a silane coupling agent having a vinyl group or an acryl group, or a primer, or a thin film of copper, chrome, nickel, or ITO may be formed on the base.

The layer may be formed of the photosensitive resin by using a method of laminating a photosensitive resin film, a method of coating a photosensitive resin composition, and the like. The lamination may be performed by laminating the base and the photosensitive resin film and applying a pressure by two rolls. A spin coating or slit coating method may be used as the coating method, but the coating method is not limited thereto. As described above, in the case where the layer is formed of the photosensitive resin, if necessary, pre-baking and/or post-baking may be performed.

According to a second aspect, an uneven portion made of metal is formed on a flexible base.

Figure 7:
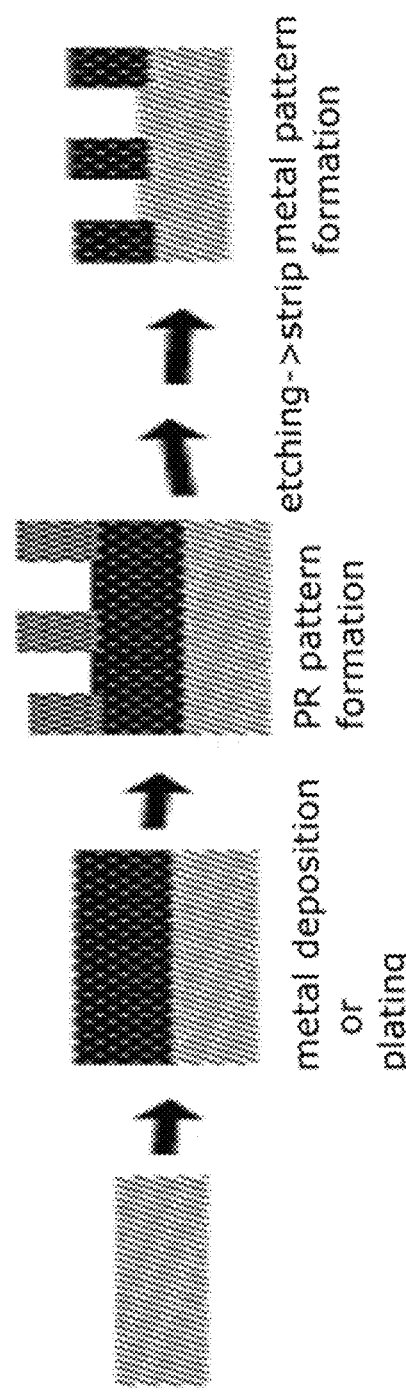

An example according to the second aspect is illustrated in FIG. 7. The uneven portion including a metal pattern may be formed by depositing or plating metal on the flexible base, forming a photoresist pattern thereon, etching the metal, and stripping the photoresist pattern.

Figure 8:
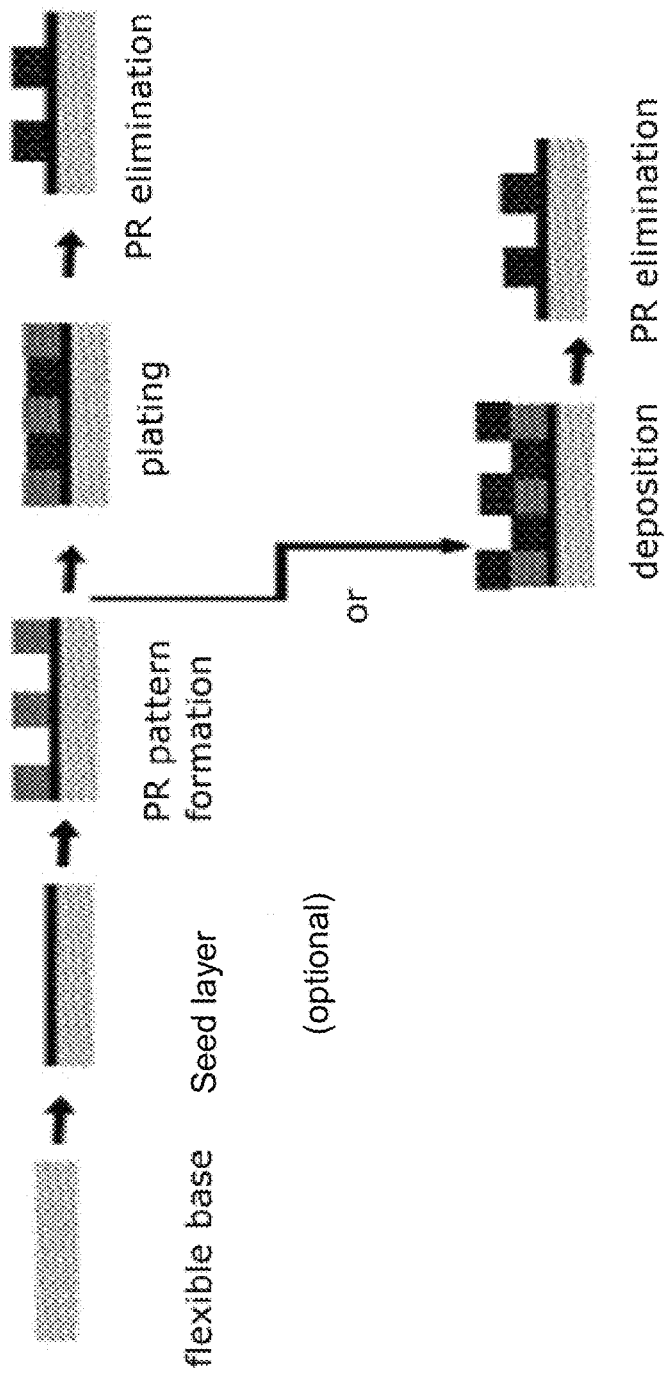

Another example according to the second aspect is illustrated in FIG. 8. The photoresist pattern is formed on the flexible base, metal is deposited or plated, and then the photoresist pattern is removed. In this case, if necessary, a seed layer may be formed on the flexible base before the photoresist pattern is formed.

In the second aspect, when a metal layer is formed, a thickness of the metal layer may be set to be 1 micrometer or more, 1.5 micrometers or more, or 2 micrometers or more. Chrome, molybdenum, or copper may be used as metal. In the case where a method illustrated in FIG. 8 is used, a thickness of the photoresist pattern may be adjusted to correspond to the thickness of the metal layer.

When the metal layer is formed, plating may be used, but deposition is advantageous in accomplishment of formation of a uniform thickness and formation of a film having a good quality.

When the metal layer is formed, in the case where electroless plating is performed, an electroless plating catalyst, for example, palladium, may be first applied before the photoresist pattern is formed. In the case where electrolytic plating is used, copper, conductive carbon, and the like may be thinly formed, for example, in a thickness of 100 nm or less, on the flexible base formed of a polymer resin, or a metal foil such as a copper foil may be used.

According to a third aspect, an uneven portion is formed on a flexible base by using a mold. In this case, primer treatment may be performed or a primer-treated base may be used in order to increase adhesion force between the base and a resin for forming the uneven portion. In this case, a UV curable resin may be used as the resin for forming the uneven portion.

Figure 9:
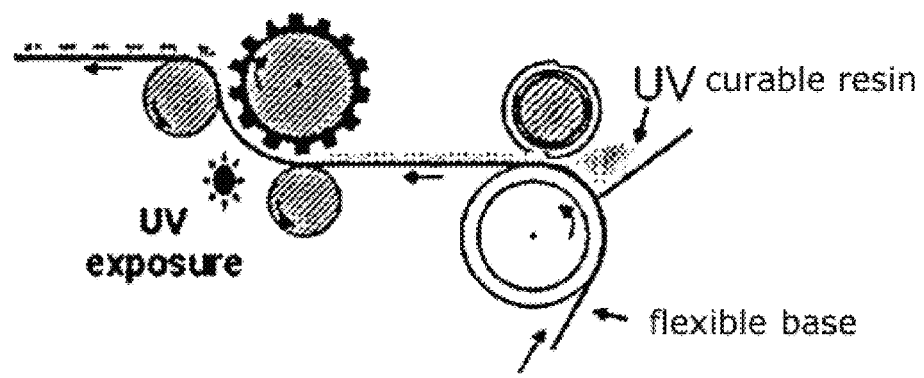

For example, the UV curable resin is applied on the flexible base, an imprint process is performed by the mold, and UV curing is performed. Since a desired pattern should be intaglioed in a final cliché, the desired pattern should be embossed in the mold. In the case where this method is used, a web where the pattern formed of the UV curable resin is embossed may be produced by a continuous process. An example of a process according to a third aspect is illustrated in FIG. 9.

The thus manufactured cliché may be used alone or while being fixed to a flat panel-type or a roll-type support body in a printing process. In this case, the cliché may further include the flat panel-type support body or the roll-type support body provided on an opposite surface of a surface of the base, on which the uneven portion is provided. In this case, the flat panel-type support body or the roll-type support body and the base may be fixed by using an adhesive, an adhesion sheet, a magnet, a jig, or the like.

According to a fifth aspect, in the method of manufacturing a cliché, the forming of an uneven portion on a flexible base further includes forming a SiOx layer on a surface of the base, on which the uneven portion is provided.

The method of manufacturing the cliché may further include performing surface activation treatment over the surface of the base, on which the uneven portion is provided, before the SiOx layer is formed. The surface activation treatment may be corona treatment, oxygen ($O_2$) plasma treatment, or UV and ozone treatment. A condition of the surface activation treatment is not particularly limited as long as bulk internal deformation of the base and the uneven portion of the base is minimized and surfaces of the base and the uneven portion of the base are changed to have a functional group having high surface energy, such as a carboxylic acid group or a hydroxy group, according to components of the base and the uneven portion of the base and the condition of the surface activation treatment. Specifically, in the case of the base where the fine uneven portion is easily formed, such as an acryl resin, stainless steel, and a metal base, the surface activation treatment may be sufficiently performed by plasma treatment under a mild condition, for example, treatment at radiofrequency (RF) power of 5 to 30 W within 5 minutes when a plasma treatment system based on PDC-002 that is a desktop type plasma washing device manufactured by Harrick Scientific Corporation is used.

The forming of the SiOx layer may be performed by a manner where a film is formed by a material that can form a SiOx film. The forming of the SiOx layer may be performed by $SiO_2$ sputtering, $SiO_2$ chemical vapor deposition, application of a TEOS (tetraethoxysilane)-based coating solution, or application of a polysilazane-based coating solution. Perhydropolysilazane (PHPS) may be used as an example of polysilazane. After the SiOx layer is formed, if necessary, a post-process such as heat treatment or radiation of UV may be performed.

Preparing of the base including the uneven portion provided on a surface thereof may be performed by 1) a manner of forming a layer by a photosensitive resin on the base, and performing developing after selective UV exposure using a photomask to form an uneven portion pattern, 2) a manner of depositing or plating metal on the base, forming a photoresist pattern thereon, etching metal, and stripping the photoresist pattern to form the uneven portion including a metal pattern, 3) a manner of forming the photoresist pattern on the base, depositing or plating metal, and removing the photoresist pattern to form the uneven portion, or 4) a manner of applying a photocurable or thermosetting resin on a mold where a desired pattern is embossed, laminating the mold and the base, performing curing, and removing the mold. The manner according to 4) may further include performing pating treatment over a surface of the mold before the resin is applied on the mold.

According to the exemplary embodiment, the pattern may be formed on the hard base by using the photosensitive resin or metal. The pattern may be formed on the hard base such as glass by the photosensitive resin, or the pattern may be formed by etching metal of the hard base on which metal is deposited. When the pattern is formed by the photosensitive resin, a photolithography process may be used. In this case, a thickness of a photosensitive resin layer may be 1 micrometer or more, and preferably 2 micrometers or more. The hard substrate on which metal is deposited may be manufactured by forming a metal layer on the substrate by using a method such as sputtering the metal. In this case, a thickness of the metal layer may be 1 micrometer or more, and preferably 2 micrometers or more. The metal pattern may be formed on the hard substrate on which metal is deposited by using a manner of forming the photoresist pattern by the photolithography process, etching the metal layer, and stripping a photoresist layer. Subsequently, the SiOx layer may be formed. Before the SiOx layer is formed, a surface of the substrate, on which the uneven portion is provided, may be subjected to activation treatment.

According to another exemplary embodiment, the pattern may be formed on the hard base by using the thermosetting or photocurable resin. The pattern may be formed by a manner of applying a curable resin composition for forming a cliché on a mother cliché, laminating the mother cliché and the hard substrate together, subsequently performing curing, and stripping the mold. In this case, in the mold, the desired pattern is embossed. In the case where the base of the cliché is the hard base, the mold may be flexible. For example, the mold of a PDMS (polydimethylsiloxane) material or the photocurable resin such as NOA (norland optical adhesive) series may be used. In this case, a depth of the pattern of the mold may be 1 micrometer or more and preferably 2 micrometers or more. The surface of the mold may be subjected to pating treatment before the curable resin composition for forming the cliché is applied. The pating treatment may be performed by a silane coupling agent having a fluorine group or a $CH_3$ group and the like. The curable resin composition for forming the cliché is not particularly limited as long as the curable resin composition includes a resin curable by heat curing or photocuring. However, a material that becomes harder than an elastic body after curing is preferable. The degree of hardness is not particularly limited, but for example, it may be more preferable that pencil hardness measured by a ASTM D 3363-74 test method be 2H or more, and the material may be used even though pencil hardness is slightly smaller than the aforementioned value. For convenience of the process, it is preferable to use the photocurable resin. In the present exemplary embodiment, the surface of the base, on which the uneven portion is provided, may be subjected to the surface activation treatment, and subsequently, the SiOx layer is formed.

According to another exemplary embodiment, the pattern may be formed on the flexible base by using the thermosetting or photocurable resin. A description of the aforementioned exemplary embodiment may be applied, except that the base is flexible.

According to another exemplary embodiment, the method of manufacturing the cliché according to the first aspect of the first exemplary embodiment may be applied (refer to FIG. 6), and after the steps according to the first aspect are performed to form the uneven portion, the SiOx layer is formed.

According to another exemplary embodiment, the method of manufacturing the cliché according to the second aspect of the first exemplary embodiment may be applied, and (refer to FIGS. 7 and 8) after the steps according to the second aspect are performed to form the uneven portion, the SiOx layer is formed.

According to another exemplary embodiment, the method of manufacturing the cliché according to the third aspect of the first exemplary embodiment may be applied, and (refer to FIG. 9) after the steps according to the second aspect are performed to form the uneven portion, the SiOx layer is formed.

In the case where the base is the flexible base, if necessary, the backing sheet or the backing plate provided at the lower end of the flexible base may be used, and the description of the first exemplary embodiment may be applied to a description of the backing sheet and the backing plate (refer to FIGS. 2 to 5).

The thus manufactured cliché may be used alone or while being fixed to the flat panel-type or the roll-type support body in the printing process. In this case, the cliché may further include the flat panel-type support body or the roll-type support body provided on the opposite surface of the surface of the base, on which the uneven portion is provided. In this case, the flat panel-type support body or the roll-type support body and the base may be fixed by using an adhesive, an adhesion sheet, a magnet, a jig, or the like.

A third exemplary embodiment of the present specification includes a printing device including the aforementioned cliché.

The printing device may further include, in addition to the cliché, a blanket roll; a coating portion provided to apply a printing composition on the blanket roll; and a print target portion, on which a print target body is equipped, provided to transfer a printing composition pattern on the blanket roll on the print target body. In this case, the cliché is provided to form the printing composition pattern on the blanket roll by removing portion of the printing composition on the blanket roll. In the case where a vacuum suction hole is provided on a support roll of the cliché, the printing device may further include a vacuum suction unit.

A fourth exemplary embodiment described in the present specification provides a printing method using the aforementioned cliché. As an example, the printing method may include a step of applying a printing composition on a blanket roll, a step of removing a portion of the printing composition on the blanket roll by the aforementioned cliché, and a step of transferring the printing composition remaining on the blanket roll on a print target body. In this case, if the steps are referred to as a coating step, a removal step, and a transferring step, all the steps may be performed simultaneously, the steps may be separately performed, and only the removal step and the transferring step may be performed simultaneously.

A roll to roll printing process is possible in various manners by using the cliché described in the present specification. The printing process using the cliché described in the present specification is illustrated in FIGS. 22 to 26.

Figure 22:
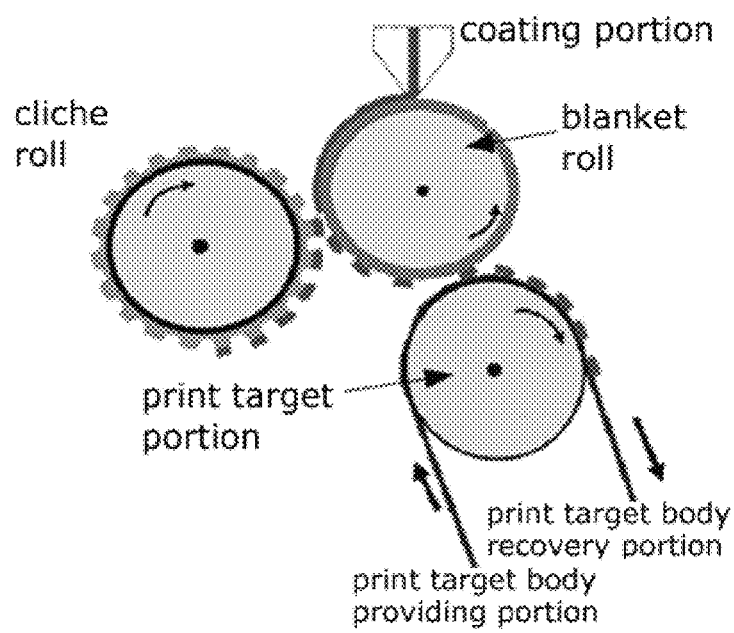
FIGS. 22 to 26 illustrate printing methods according to the exemplary embodiments described in the present specification.

According to FIG. 22, a portion of the printing composition on the blanket roll may be removed by using the cliché according to the present invention while the printing composition is applied on the blanket roll, and the printing composition remaining on the blanket roll may be transferred on the print target portion.

Figure 23:
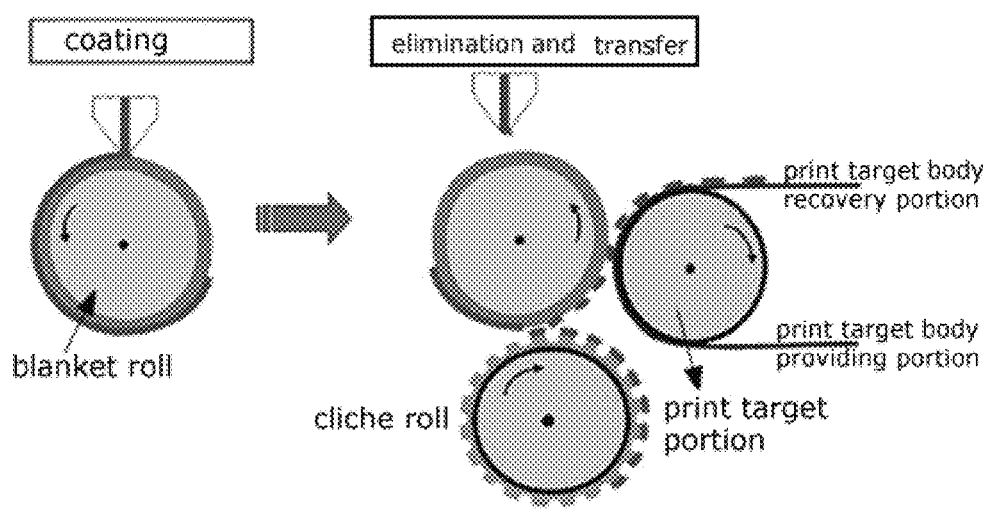

According to FIG. 23, the printing composition may be first applied on the blanket roll, and subsequently, while a portion of the printing composition on the blanket roll is removed by using the cliché according to the present invention, the printing composition remaining on the blanket roll may be transferred on the print target portion.

Figure 24:
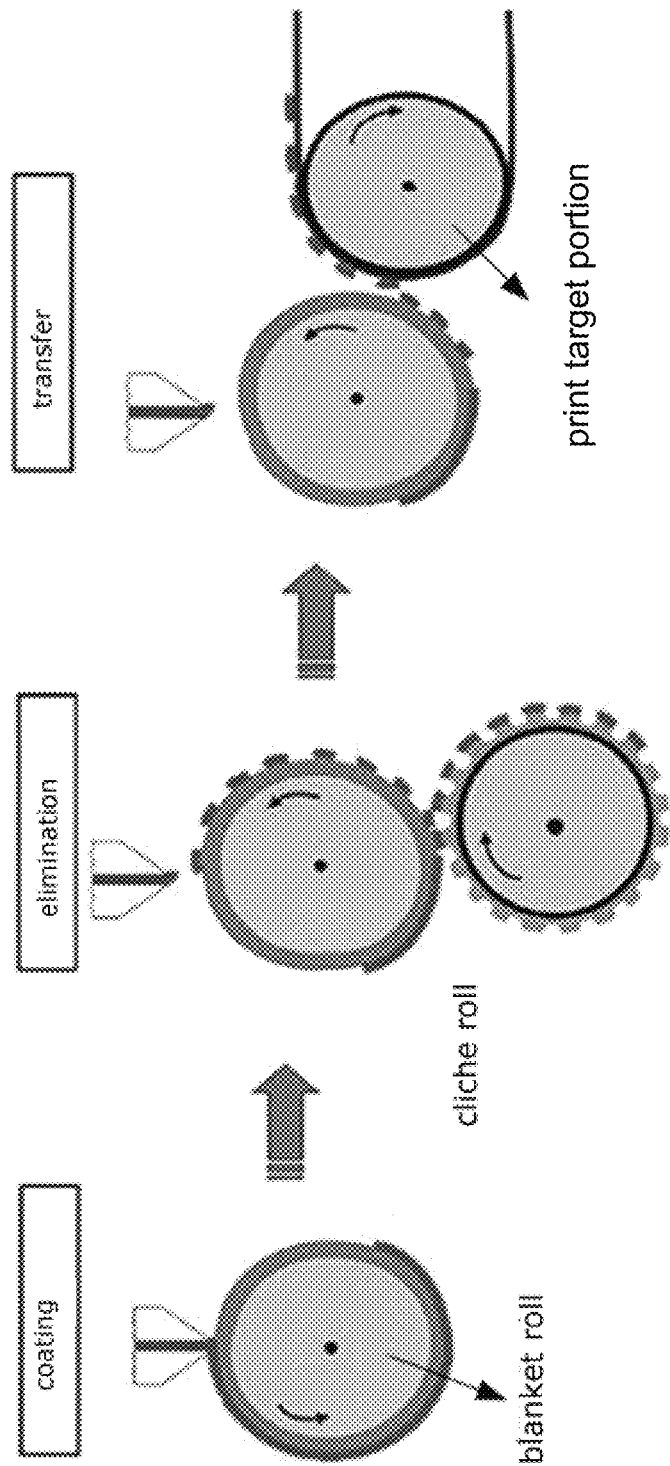

According to FIG. 24, the step of applying the printing composition on the blanket roll, the step of removing a portion of the printing composition on the blanket roll by using the cliché according to the present invention, and the step of transferring the printing composition remaining on the blanket roll on the print target portion may be separately performed.

Figure 25:
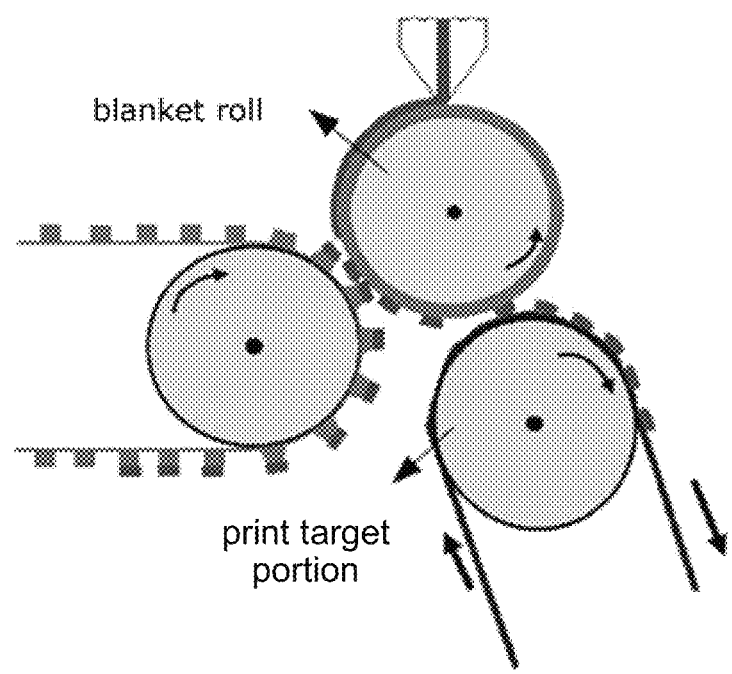

According to FIG. 25, like FIG. 22, a portion of the printing composition on the blanket roll is removed by using the cliché according to the present invention while the printing composition is applied on the blanket roll, and the printing composition remaining on the blanket roll is transferred on the print target portion. However, the cliché where the printing composition on the blanket roll is removed may be separately washed or may become disposable by not fixing the cliché described in the present specification to a roll-type support portion but allowing the cliché to be temporarily supported by the roll-type support portion.

FIGS. 22 to 25 are only to illustrate the present invention, but the scope of the present invention is not limited thereto.

Hereinafter, the exemplary embodiments described in the present specification will be exemplified through Examples. However, the scope of the exemplary embodiments is not intended to be limited by the following Examples.

EXAMPLE

Figure 26:
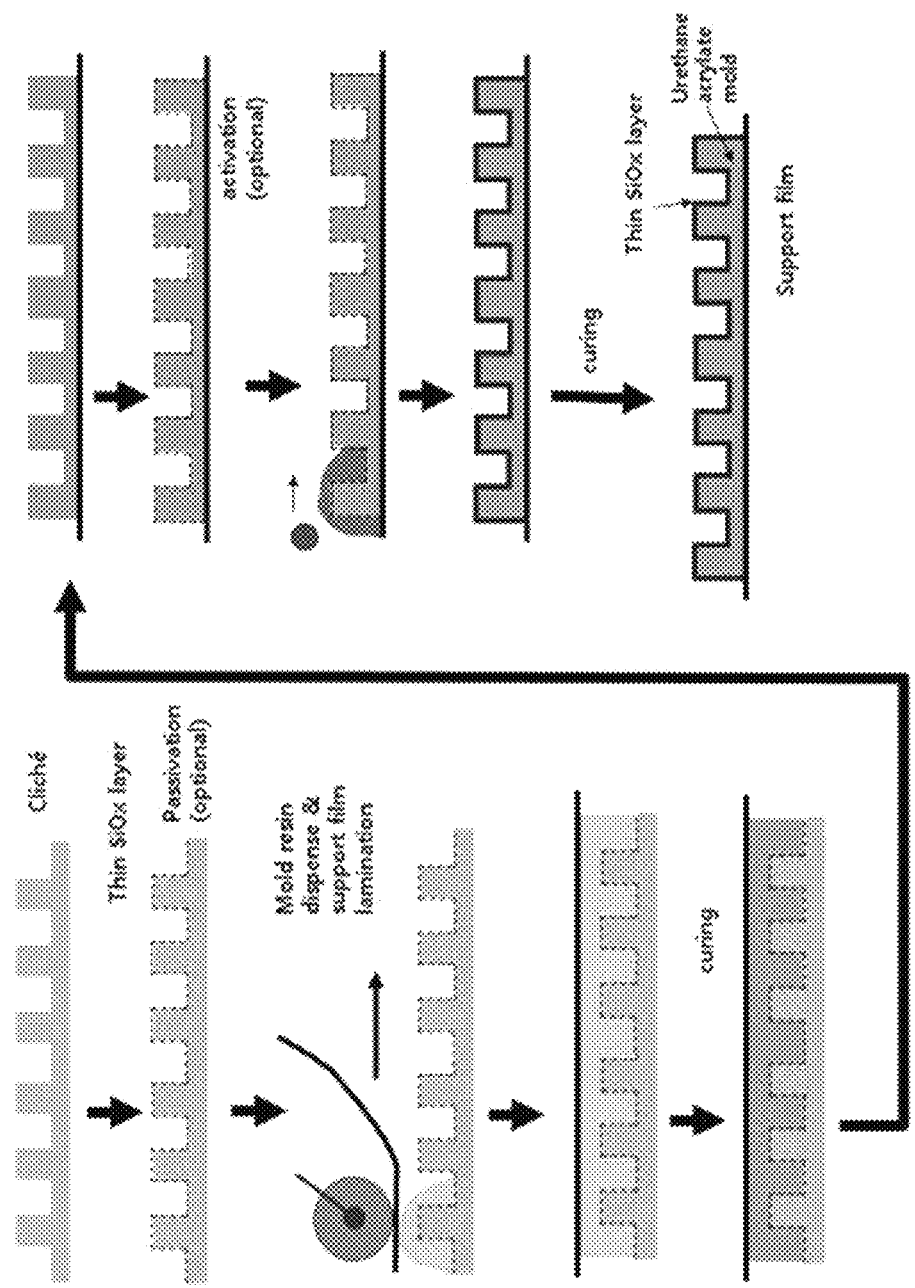

A process schematic diagram according to the second exemplary embodiment is illustrated in FIG. 26.

The mother cliché made of glass was prepared. The mother cliché was immersed in the hexane solution including 0.3 wt % of perfluorooctyltrichlorosilane for 2 hours, and then washed by sequentially using hexane and acetone. Subsequently, the mother cliché was subjected to passivation by performing blow drying.

Subsequently, MINS-311RM (Minuta Technology Co., Ltd., Gyeonggi-do) that was the photocurable urethane acrylate mold composition was dispensed to one side of the mother cliché. Subsequently, the prepared mother cliché was laminated together with PET (Skyrol SH34, SKC) subjected to primer treatment.

After the mold composition was cured by radiation of UV, the mother cliché was stripped to manufacture the mold. Subsequently, the mold was subjected to oxygen ($O_2$) plasma treatment. In this case, surface energy of the mold immediately after the oxygen plasma treatment was 63 dyn/cm (calculated from the water contact angle of 4° and the diiodomethane contact angle of 14°).

Subsequently, GCM-8005 (AZ Electronic Materials) that was the polysilazane coating solution was applied on the mold by bar coating, and subjected to heat treatment at 100° C. for 5 minutes and at 150° C. for 30 minutes. Surface energy of the thus manufactured cliché was 47 dyn/cm (calculated from the water contact angle of 13° and the diiodomethane contact angle of 45°).

Figure 13:
FIG. 13 is a picture obtained by photographing a bending state of the cliché manufactured in an Example.
Figure 14:
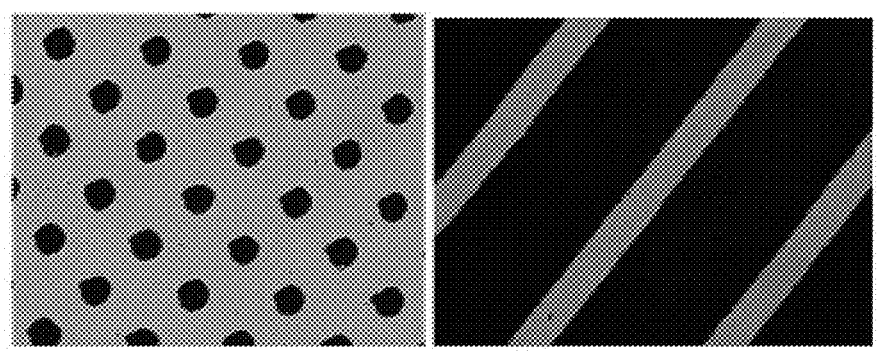
FIG. 14 illustrates a printing state using the cliché manufactured in the Example.

The picture obtained by photographing the thus manufactured cliché in a bending state is illustrated in FIG. 13. Further, results of printing using the cliché are illustrated in FIG. 14.

Comparative Example 1

Figure 15:
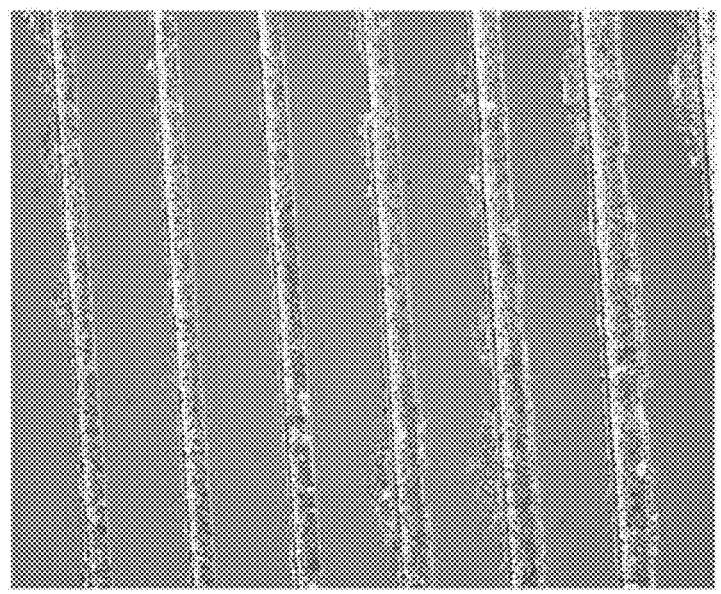
FIG. 15 illustrates a printing state using the cliché manufactured in Comparative Example 1.

The same procedure as the Example was performed, except that coating using the polysilazane coating solution was not performed. In this case, surface energy of the cliché that was not coated with polysilazane and was made of urethane acrylate was 32 dyn/cm (calculated from the water contact angle of 80° and the diiodomethane contact angle of 59°). Results of printing using the cliché manufactured in the present Comparative Example are illustrated in FIG. 15.

Comparative Example 2

The mother cliché made of glass was prepared. The mother cliché was immersed in the hexane solution including 0.3 wt % of perfluorooctyltrichlorosilane for 2 hours, and then washed by sequentially using hexane and acetone. Subsequently, the mother cliché was subjected to passivation by performing blow drying.

Subsequently, MIN-311RM (Minuta Technology Co., Ltd., Gyeonggi-do) that was the photocurable urethane acrylate mold composition was dispensed to one side of the mother cliché. Subsequently, the prepared mother cliché was laminated together with PET (Skyrol SH34, SKC) subjected to primer treatment. After the mold composition was cured by radiation of UV, the mother cliché was stripped to manufacture the mold.

Figure 27:
FIG. 27 illustrates a coating shape of the cliché manufactured in Comparative Example 2.

Subsequently, the mold was not subjected to surface activation treatment such as oxygen ($O_2$) plasma treatment, but soon after, GCM-8005 (AZ Electronic Materials) that was the polysilazane coating solution was applied on the mold by bar coating, and when the coating phenomenon was observed, dewetting of the coating solution was serious enough to be apparently distinguished by the naked eye like FIG. 27, and thus the process of forming SiOx could not be performed any more. In this case, surface energy of the mold that was not subjected to the oxygen plasma treatment was 32 dyn/cm (calculated from the water contact angle of 80° and the diiodomethane contact angle of 59°).

What is claimed is:

1. A cliché comprising:
a support roll;
a flexible base provided to surround at least one surface of the support roll and having an uneven portion, and
a porous sheet provided between the support roll and the flexible base,
wherein both ends of the flexible base in a circumferential direction of the support roll are fixed to the support roll by a magnet, and
wherein the support roll has a groove portion in a direction that is parallel to a rotation axis of the roll, and the ends of the flexible base are fixed in the groove portion by the magnet or the ends of the flexible base are fixed to the support roll in the groove portion.

2. The cliché of claim 1, wherein a buffer layer for improving adhesion force is provided between the flexible base and the uneven portion, or the flexible base is subjected to pre-treatment for improvement of the adhesion force.

3. The cliché of claim 1, wherein a depth of the uneven portion is 1 micrometer or more.

4. The cliché of claim 1, comprising:
a $SiO_x$ layer provided on a surface of the base, on which the uneven portion is provided, wherein x is from 1 to 2.

5. The cliché of claim 4, wherein a thickness of the $SiO_x$ layer is from 10 nm to 2 mm.

6. The cliché of claim 4, wherein a surface energy of the $SiO_x$ layer is from 40 dyn/cm to 4,000 dyn/cm.

7. The cliché of claim 4, wherein a surface energy of the $SiO_x$ layer is from 40 dyn/cm to 70 dyn/cm.

8. The cliché of claim 1, wherein an average pore size of the porous sheet is from 0.1 μm to 100 μm.

9. The cliché of claim 1, wherein the porous sheet is any one of a sintered bodies of a polymer, metal and ceramic.

10. The cliché of claim 1, wherein a porosity of the porous sheet is from 10% to 50%.

11. The cliché of claim 1, wherein a vacuum suction hole is provided in the support roll.

12. The cliché of claim 1, wherein the fixing is performed by a chemical fixing unit or a physical fixing unit.

13. A printing device comprising:
the cliché according to claim 1.

14. A printing method comprising:
applying a printing composition on a blanket roll,
removing a portion of the printing composition on the blanket roll by the cliché according to claim 1, and
transferring the printing composition remaining on the blanket roll on a print target body.

15. The printing method of claim 14, wherein the applying of the printing composition, the removing of the portion of the printing composition, and the transferring of the printing composition are performed simultaneously.

16. The printing method of claim 14, wherein the removing of the portion of the printing composition on the blanket roll by the cliché, and the transferring of the printing composition remaining on the blanket roll on the print target body are performed simultaneously.

\* \* \* \* \*